(12) United States Patent
Van De Beek et al.

(10) Patent No.: US 7,567,131 B2
(45) Date of Patent: Jul. 28, 2009

(54) DEVICE FOR ULTRA WIDE BAND FREQUENCY GENERATING

(75) Inventors: Remco Cornelis Herman Van De Beek, Eindhoven (NL); Dominicus Martinus Wilhelmus Leenaerts, Eindhoven (NL); Gerard Van Der Weide, Eindhoven (NL); Jozef Reinerus Maria Bergervoet, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 140 days.

(21) Appl. No.: 11/574,916

(22) PCT Filed: Sep. 5, 2005

(86) PCT No.: PCT/IB2005/052893

§ 371 (c)(1),
(2), (4) Date: Mar. 8, 2007

(87) PCT Pub. No.: WO2006/030342

PCT Pub. Date: Mar. 23, 2006

(65) Prior Publication Data

US 2007/0257737 A1 Nov. 8, 2007

(30) Foreign Application Priority Data

Sep. 14, 2004 (EP) .................................. 04104423

(51) Int. Cl.
*H03L 7/00* (2006.01)
(52) U.S. Cl. ................ 331/2; 331/45; 331/46; 332/127; 329/358; 455/260; 375/316; 375/344
(58) Field of Classification Search ................ 332/107, 332/127; 375/295, 296; 331/2, 45, 46; 329/358; 455/260
See application file for complete search history.

(56) References Cited

U.S. PATENT DOCUMENTS 5,408,201 A 4/1995 Uriya
6,211,708 B1 4/2001 Klemmer (Continued)

FOREIGN PATENT DOCUMENTS

EP 1255356 A1 11/2002

(Continued)

OTHER PUBLICATIONS

Written Opinion of the International Searching Authority PCT-IB2005-052893.

*Primary Examiner*—Arnold Kinkead

(57) ABSTRACT

Devices (1) for exchanging ultra wide band signals comprise frequency translating stages (20,30) for frequency translating signals and oscillating stages (40) for supplying main inphase/quadrature oscillation signals to the frequency translating stages (20,30). By providing the oscillating stages (40) with polyphase filters (43,44) for reducing harmonics in oscillation signals, the main oscillation signals will be sufficiently clean. The oscillating stages (40) comprise mixers (46) for converting first inphase/quadrature oscillation signals and second inphase/quadrature oscillation signals into the main oscillation signals. The polyphase filters (43,44) may be located before and after the mixers (46). Frequency selectors (45) replace prior art multiplexers located after the mixers (46). Such frequency selectors (45) comprise multiplexers (126,127) for supplying the second inphase/quadrature oscillation signals, with a combination of these second oscillation signals corresponding with a positive frequency, a negative frequency or a zero frequency, and comprise coders (125) for controlling the multiplexers (126,127).

23 Claims, 5 Drawing Sheets

U.S. PATENT DOCUMENTS

Figure 1:
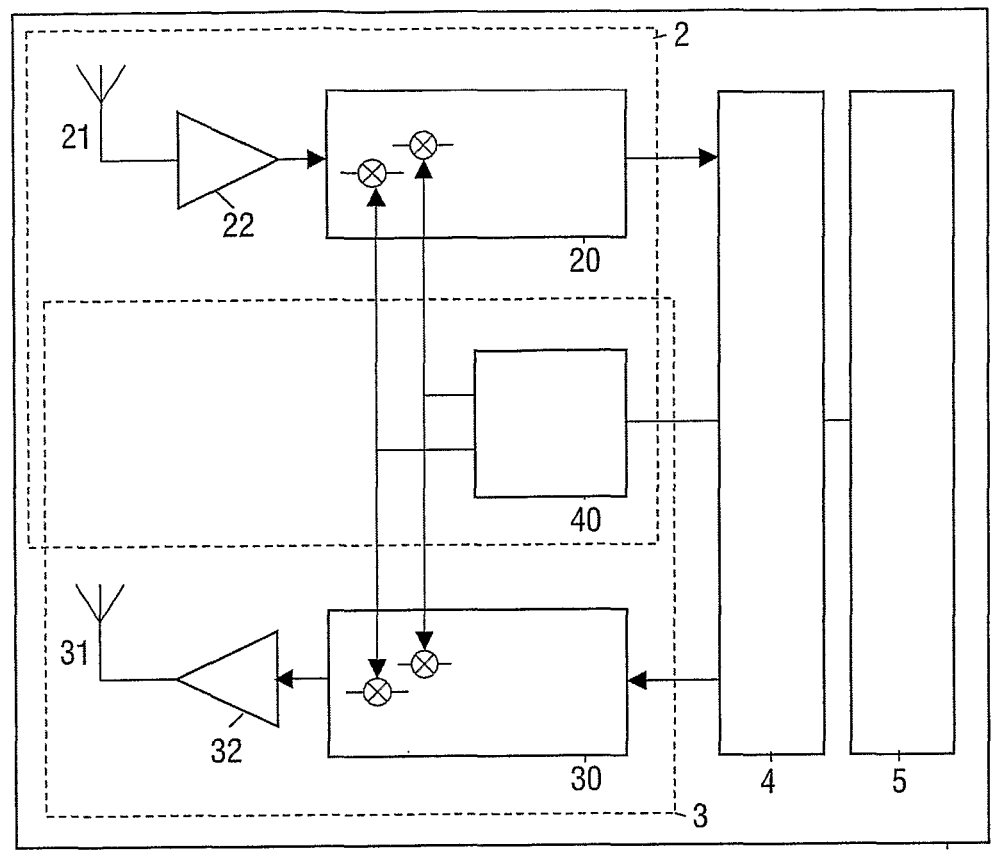

| | | |
|---|---|---|
| 6,404,293 B1 | 6/2002 | Darabi et al. |
| 6,459,341 B1 | 10/2002 | Oga |
| 6,493,410 B1 | 12/2002 | Shalom et al. |
| 7,095,801 B1 * | 8/2006 | Magoon et al. ............. 375/302 |
| 7,142,614 B2 * | 11/2006 | Takinami et al. ............ 375/295 |
| 2001/0031627 A1 | 10/2001 | Ries |
| 2003/0155949 A1 | 8/2003 | Itkin et al. |

FOREIGN PATENT DOCUMENTS

WO  0231962 A2  4/2002

\* cited by examiner

DEVICE FOR ULTRA WIDE BAND FREQUENCY GENERATING

The invention relates to a device, and also relates to an oscillating stage, to a frequency selector, to a system, and to a method.

Examples of such a device are receivers, transmitters and transceivers for exchanging ultra wide band signals, such as wireless interfaces, wireless terminals and wireless stations.

A prior art device is known from U.S. Pat. No. 6,404,293 B1, which discloses, in its FIG. 1, a device comprising a transmitter and a receiver both coupled to a local oscillator generator (an oscillating stage). As disclosed in its FIG. 2, the transmitter and the receiver each comprise a mixer stage (a frequency translating stage), and the local oscillator generator comprises an oscillator. In the receiver, the mixer stage frequency translates a first signal in the form of an ultra wide band signal into a second signal in the form of an intermediate frequency signal. In the transmitter, the mixer stage frequency translates a first signal in the form of an intermediate frequency signal into a second signal in the form of an ultra wide band signal.

The known device is disadvantageous, inter alia, owing to the fact that oscillation signals originating from the local oscillator generator are insufficiently clean. A divide-by-N divider situated between the oscillator and a further mixer in the oscillator stage will generate harmonics.

It is an object of the invention, inter alia, to provide a device comprising an oscillating stage for generating sufficiently clean oscillation signals.

Further objects of the invention are, inter alia, to provide an oscillation stage, a frequency selector, a system and a method, all for use in (combination with) a device comprising an oscillating stage for generating sufficiently clean oscillation signals.

The device according to the invention comprises:
a frequency translating stage for frequency translating a first signal into a second signal, at least one of the first signal and the second signal being an ultra wide band signal; and
an oscillating stage for supplying a main inphase oscillation signal and a main quadrature oscillation signal to the frequency translating stage, which oscillating stage comprises at least one polyphase filter for reducing at least one harmonic in at least one oscillation signal.

By introducing one or more polyphase filters in the oscillating stage for reducing at least one harmonic in at least one oscillation signal, the main oscillation signals will be sufficiently clean. Compared to band pass filters, polyphase filters offer more possibilities to suppress unwanted signals better, but require inphase and quadrature oscillation signals. Owing to the fact that inphase and quadrature oscillation signals are used, the polyphase filtering can be introduced.

In an ultra wide band, which is a band of frequency channels for example situated above 1 GHz, the main oscillation signals must be clean, especially under severe interferers or interferer scenarios. This is especially challenging under severe frequency hopping requirements, such as for example a switching time of about 9 nsec and a use of a band of about 300 nsec.

It should be noted that U.S. Pat. No. 6,404,293 B1 discloses, in its FIG. 14, a polyphase filter situated in the oscillator stage. But as disclosed in its column 16 lines 16-26, this polyphase filter is used for getting an inphase and a quadrature signal from a single phase voltage controlled oscillator. So, this polyphase filter converts a single phase oscillation signal into an inphase and a quadrature oscillation signal. This polyphase filter is not used for reducing at least one harmonic in at least one oscillation signal.

An embodiment of the device according to the invention is defined by the oscillating stage further comprising a mixer for converting a first inphase oscillation signal and a first quadrature oscillation signal and a second inphase oscillation signal and a second quadrature oscillation signal into the main oscillation signals. This mixer, such as for example a single side band mixer, allows the device to be tuned to an ultra wide band of a group of ultra wide bands, such as for example defined by the Multi-Band Orthogonal Frequency Division Multiplexing Alliance (MBOA) for the industrial standard IEEE802.15.3a (WPAN).

An embodiment of the device according to the invention is defined by an input of the polyphase filter being coupled to an output of the mixer. This polyphase filter reduces harmonics in the main oscillation signals. The polyphase filter may be coupled directly to the mixer without any element being in between, or may be coupled indirectly to the mixer, via an element.

An embodiment of the device according to the invention is defined by an output of the polyphase filter being coupled to an input of the mixer. This polyphase filter reduces harmonics in the first oscillation signal or in the second oscillation signal, and as a result, the main oscillation signals will also show reduced harmonics. The polyphase filter may be coupled directly to the mixer without any element being in between, or may be coupled indirectly to the mixer, via an element.

An embodiment of the device according to the invention is defined by the oscillating stage further comprising a frequency selector, an output of the frequency selector being coupled to an input of the mixer. This frequency selector is located before the mixer and replaces prior art multiplexers located after the mixer. Such prior art multiplexers cause disturbances in the main oscillation signal and consume quite some power.

An embodiment of the device according to the invention is defined by the frequency selector comprising:
a multiplexer for supplying the second inphase oscillation signal and the second quadrature oscillation signal, a combination of these second oscillation signals corresponding with a positive frequency, a negative frequency or a zero frequency; and
a coder for controlling the multiplexer.

This frequency selector is capable of supplying the second oscillation signals, a combination of these (complex) second oscillation signals corresponding with a positive frequency, a negative frequency or a zero frequency, and, as a result, the device can be tuned to three different ultra wide bands (with a center frequency of a first band being defined by a first oscillation signal minus a second oscillation signal, with a center frequency of a second band being defined by a first oscillation signal, and with a center frequency of a third band being defined by a first oscillation signal plus a second oscillation signal).

An embodiment of the device according to the invention is defined by the oscillating stage further comprising a first oscillator for supplying the first oscillation signals and a second oscillator for supplying the second oscillation signals. The use of separate oscillators for supplying the separate oscillation signals to the mixer allows the use of separate polyphase filters.

An embodiment of the device according to the invention is defined by the oscillating stage further comprising a reference source coupled to the first and the second oscillator. Such a reference source provides both oscillators with the same reference clock signal.

An embodiment of the device according to the invention is defined by the reference source being a X MHz source, the first oscillator being a part of a first phase locked loop generating at A·B·X MHz via a divide-by-A divider and a divide-by-B divider for supplying the first oscillation signal at B·X MHz via the divide-by-A divider, the second oscillator being a part of a second phase locked loop generating at C·D·X MHz via a divide-by-C divider and a divide-by-D divider for supplying the second oscillation signal at D·X MHz via the divide-by-C divider. X for example equals 44, A for example equals 2, B for example equals 90, C for example equals 4 and D for example equals 12. Then, A·B·X equals 7920, B·X equals 3960, C·D·X equals 2112 and D·X equals 528. This way, a first band is situated around 3432 MHz, a second band is situated around 3960 MHz, and a third band is situated around 4488 MHz.

An embodiment of the device according to the invention is defined by the stages forming part of a receiver, which receiver comprises an antenna coupled to an input of the frequency translating stage via an amplifier, the first signal being an ultra wide band signal and the second signal being a base band signal.

An embodiment of the device according to the invention is defined by the stages forming part of a transmitter, which transmitter comprises an antenna coupled to an output of the frequency translating stage via an amplifier, the first signal being a base band signal and the second signal being an ultra wide band signal.

The oscillating stage according to the invention for supplying a main inphase oscillation signal and a main quadrature oscillation signal to a frequency translating stage for frequency translating a first signal into a second signal, at least one of the first signal and the second signal being an ultra wide band signal, comprises at least one polyphase filter for reducing at least one harmonic in at least one oscillation signal.

The frequency selector according to the invention comprises:
  a multiplexer for supplying oscillation signals, a combination of these oscillation signals corresponding with a positive frequency, a negative frequency or a zero frequency;
  a coder for controlling the multiplexer; and
  an output to be coupled to an input of a mixer for converting a first inphase oscillation signal and a first quadrature oscillation signal and a second inphase oscillation signal and a second quadrature oscillation signal into a main inphase oscillation signal and a main quadrature oscillation signal of an oscillating stage for supplying the main oscillation signals to a frequency translating stage for frequency translating a first signal into a second signal, at least one of the first signal and the second signal being an ultra wide band signal, which oscillating stage comprises at least one polyphase filter for reducing at least one harmonic in at least one oscillation signal.

The system according to the invention comprises at least two devices, which devices each comprise:
  a frequency translating stage for frequency translating a first signal into a second signal, at least one of the first signal and the second signal being an ultra wide band signal; and
  an oscillating stage for supplying a main inphase oscillation signal and a main quadrature oscillation signal to the frequency translating stage, which oscillating stage comprises at least one polyphase filter for reducing at least one harmonic in at least one oscillation signal.

An embodiment of the system according to the invention is defined by a device comprising a terminal device and an other device comprising a station device.

The method according to the invention for use in a device is defined by comprising the steps of:
  frequency translating a first signal into a second signal, at least one of the first signal and the second signal being an ultra wide band signal;
  supplying a main inphase oscillation signal and a main quadrature oscillation signal for said frequency translating; and
  polyphase filtering at least one oscillation signal for reducing at least one harmonic in at least one oscillation signal.

Embodiments of the oscillating stage according to the invention and of the frequency selector according to the invention and of the system according to the invention and of the method according to the invention correspond with the embodiments of the device according to the invention.

The invention is based upon an insight, inter alia, that polyphase filtering offers more possibilities to suppress unwanted signals better, but requires inphase and quadrature oscillation signals to be used, and is based upon a basic idea, inter alia, that, owing to the fact that inphase and quadrature oscillation signals are used, polyphase filtering can be introduced.

The invention solves the problem, inter alia, to provide a device comprising an oscillating stage for generating sufficiently clean oscillation signals, and is advantageous, inter alia, in that the device can be used under severe frequency hopping requirements.

These and other aspects of the invention will be apparent from and elucidated with reference to the embodiments(s) described hereinafter.

Figure 2:
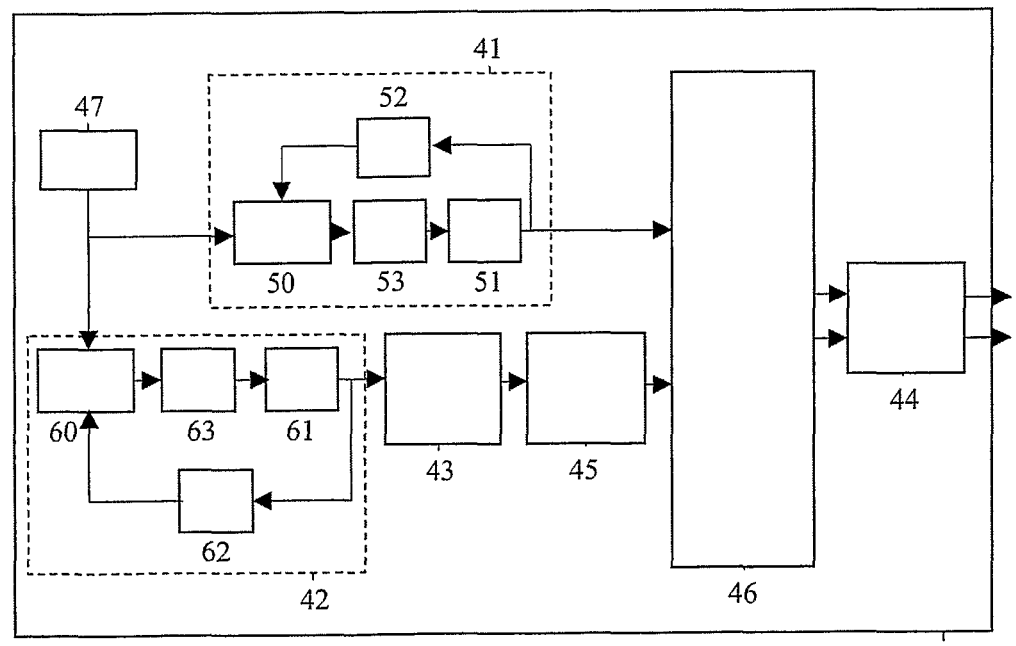
Figure 3:
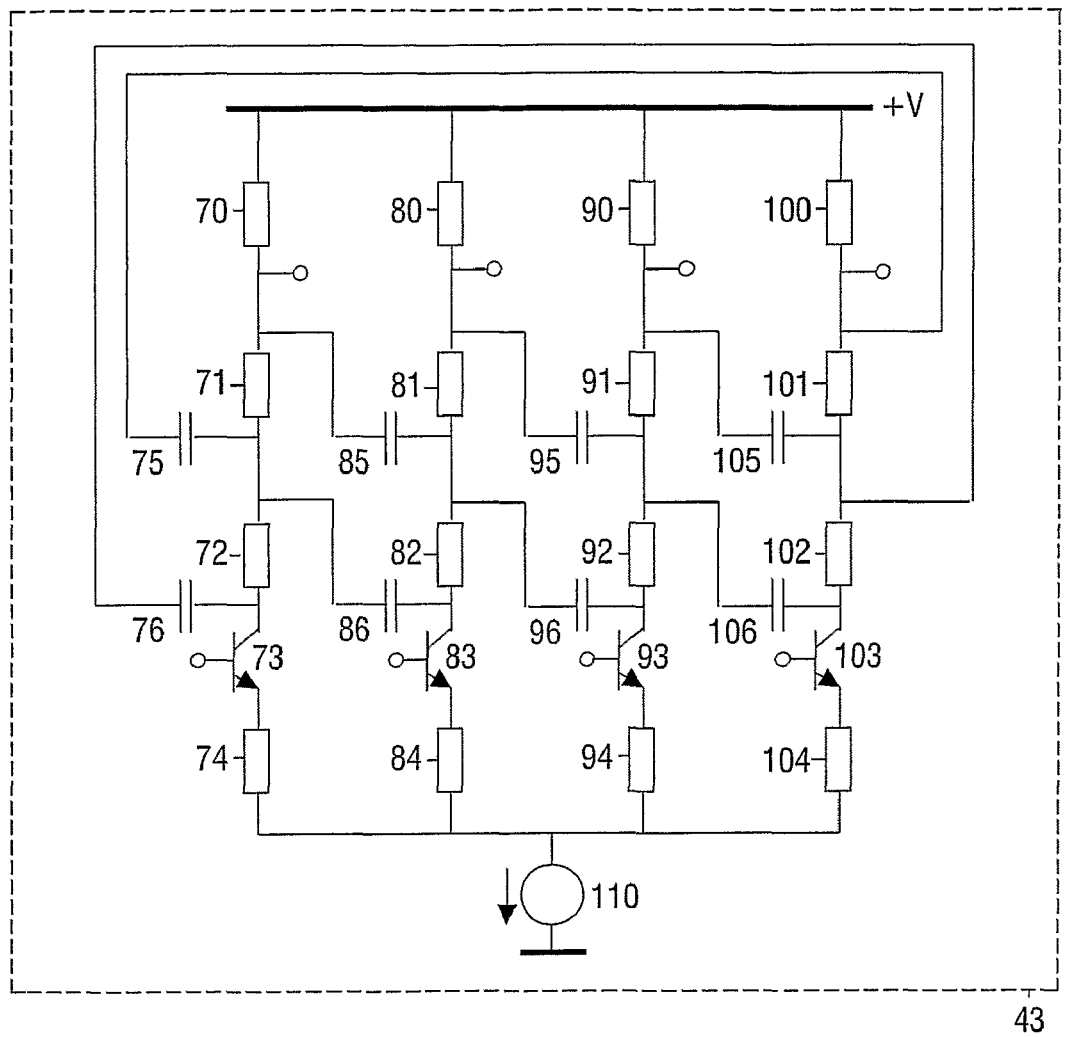
Figure 4:
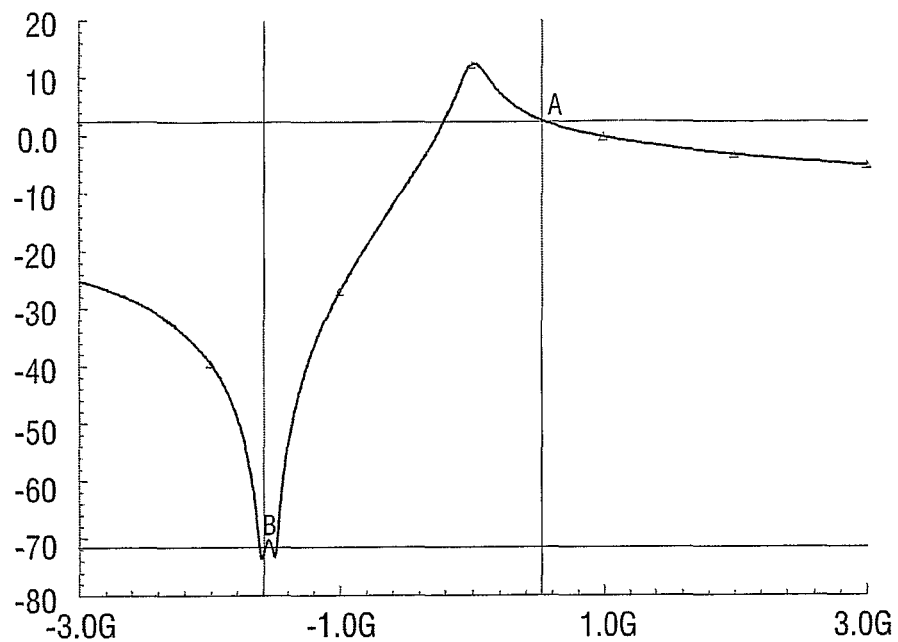
Figure 5:
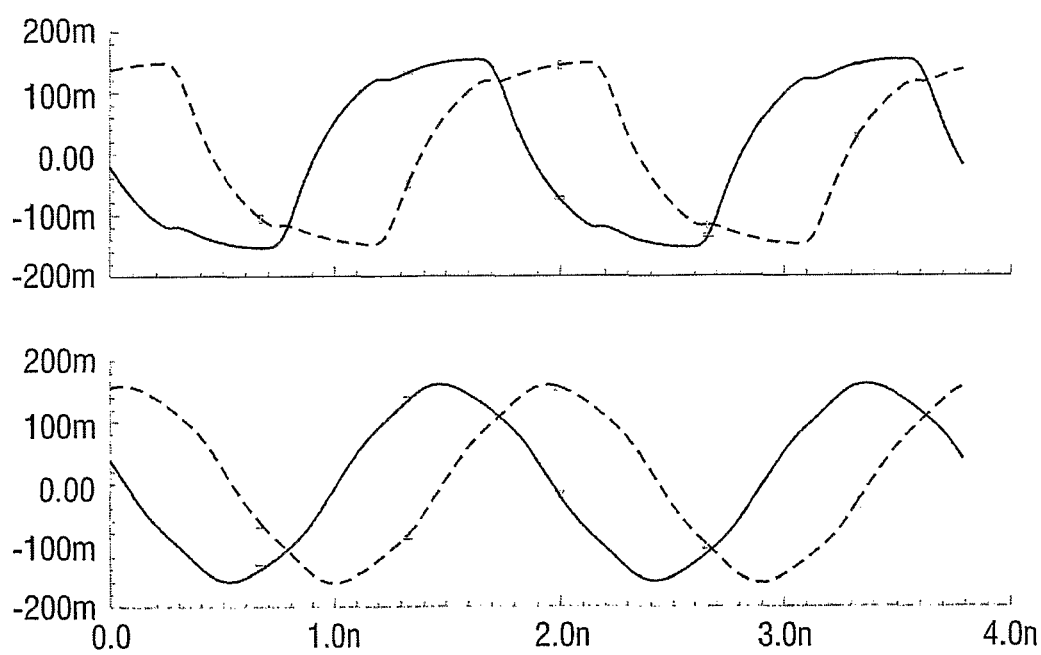
Figure 6:
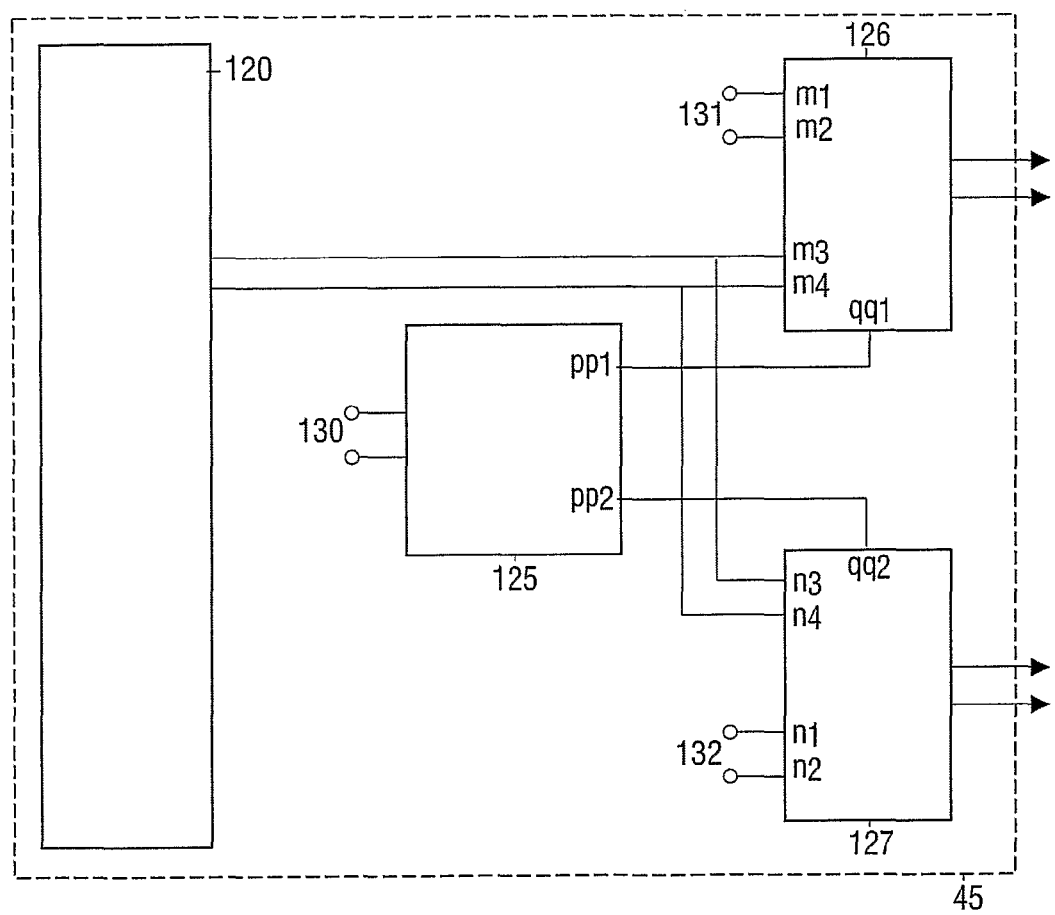
Figure 7:
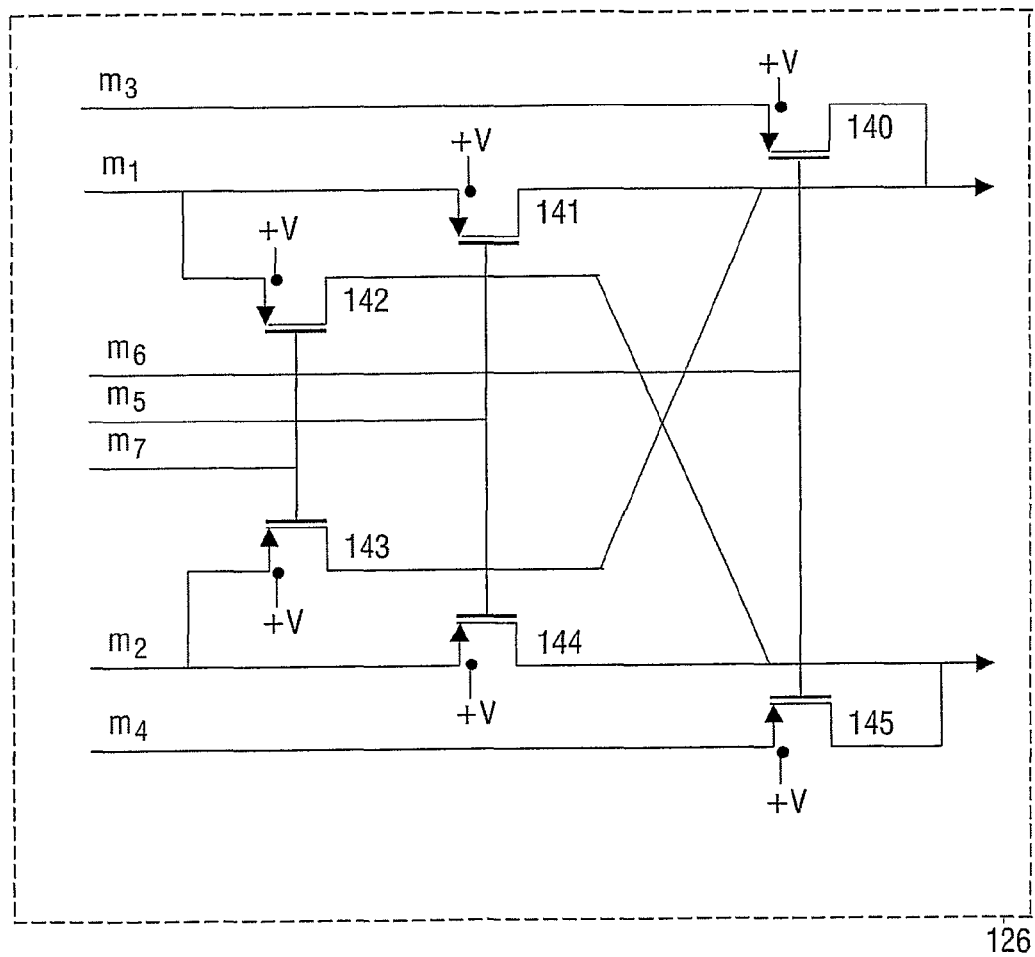

In the Drawings:
  FIG. 1 shows diagrammatically a device according to the invention;
  FIG. 2 shows diagrammatically an oscillating stage according to the invention;
  FIG. 3 shows diagrammatically a polyphase filter;
  FIG. 4 shows a polyphase transfer of the polyphase filter;
  FIG. 5 shows a polyphase filter time domain response;
  FIG. 6 shows diagrammatically a frequency selector according to the invention; and
  FIG. 7 shows diagrammatically a multiplexer for the frequency selector.

The device 1 according to the invention shown in FIG. 1 comprises a receiver 2 and a transmitter 3. The receiver 2 comprises an antenna 21 coupled via an amplifier 22 to a frequency translating stage 20. The transmitter 3 comprises an antenna 31 coupled via an amplifier 32 to a frequency translating stage 30. Both frequency translating stages are further coupled to a processing stage 4, which is further coupled to a controller 5. The processing stage 4 for example comprises filters, amplifiers, synchronizers, pilot inserters/removers, (de)interleavers, (de)coders and (de)scramblers all not shown, and the controller 5 for example comprises a processor, a memory and a man-machine-interface all not shown.

An oscillating stage 40 according to the invention for supplying a main inphase oscillation signal and a main quadrature oscillation signal to the frequency translating stage 20,30 forms part of the receiver 2 and the transmitter 3. Alternatively, the receiver 2 and the transmitter 3 may have separate oscillating stages. The oscillating stage 40 is shown in greater detail in FIG. 2.

The oscillating stage 40 according to the invention shown in FIG. 2 comprises a first phase locked loop 41 for supplying a first inphase oscillation signal and a first quadrature oscillation signal and a second phase locked loop 42 for supplying a second inphase oscillation signal and a second quadrature oscillation signal. The phase locked loop 41,42 comprises a phase detector circuit 50,60 coupled to a reference source 47, and comprises a first divider 51,61 coupled to the phase detector circuit 50,60 via an oscillator 53,63. The first divider 51,61 is coupled to a second divider 52,62, which is further coupled to the phase detector circuit 50,60. The first divider 51 is further coupled to a first input of a mixer 46, and the first divider 61 is further coupled via a polyphase filter 43 and via a frequency selector 45 to a second input of the mixer 46. An output of the mixer 46 is coupled to a polyphase filter 44. Because of the first (second) inphase oscillation signal being a differential signal (0°,180°) and because of the first (second) quadrature oscillation signal being a differential signal (90°, 270°), each coupling shown between the phase locked loops 41,42 and the mixer 46 (possibly via the polyphase filter 43 and the frequency selector 45) comprises four sub-couplings. Because of the main inphase oscillation signal being a differential signal (0°,180°) and because of the main quadrature oscillation signal being a differential signal (90°,270°), each (inphase and quadrature) coupling shown between the mixer 46 and the polyphase filter 44 and at the output of this polyphase filter 46 comprises two sub-couplings. The mixer 46 for example comprises a single side band mixer as disclosed in U.S. Pat. No. 6,404,293.

About the phase locked loops 41,42 and the reference source 47, the reference source 47 may be a X MHz source, with the first phase locked loop 41 generating at A·B·X MHz via a divide-by-A divider 51 and a divide-by-B divider 52 for supplying the first oscillation signal at B·X MHz via the divide-by-A divider 51, and with the second phase locked loop 42 generating at C·D·X MHz via a divide-by-C divider 61 and a divide-by-D divider 62 for supplying the second oscillation signal at D·X MHz via the divide-by-C divider 61. X for example equals 44, A for example equals 2, B for example equals 90, C for example equals 4 and D for example equals 12. Then, A·B·X equals 7920, B·X equals 3960, C·D·X equals 2112 and D·X equals 528. This way, a first band is situated around 3432 MHz, a second band is situated around 3960 MHz, and a third band is situated around 4488 MHz.

The polyphase filter 43 shown in greater detail in FIG. 3 comprises four branches, a first (second,third,fourth) branch comprising a serial circuit of a first, a second and a third resistor 70-72 (80-82,90-92,100-102), a transistor 73 (83,93, 103) and a fourth resistor 74 (84,94,104). One side of the fourth resistors 74,84,94,104 is coupled via a current source 110 to ground. One side of the first resistors 70,80,90,100 is coupled to a voltage supply +V, the other sides constitute the outputs of the polyphase filter 43. These outputs may further be buffered by buffering transistors not shown. The control electrodes (basis) of the transistors 73,83,93,103 constitute the inputs of the polyphase filter 43, the first main electrodes (emitters) are coupled to the other sides of the fourth resistors 74,84,94,104, and the second main electrodes (collectors) are coupled to one side of the third resistors 72,82,92,102 and via capacitors 76,86,96,106 to the other side of the third resistors 102,72,82,92 in a previous branch (the last branch forms the previous branch for the first branch). These other sides of the third resistors 72,82,92,102 are coupled to one side of the second resistors 71,81,91,101, which one sides are coupled via capacitors 75,85,95,105 to the other sides of the second resistors 101,71,81,91 in a previous branch (the last branch forms the previous branch for the first branch). The polyphase filter 44 may for example comprise a similar construction.

In FIG. 4, the polyphase transfer of the polyphase filter 43 is shown, in dB (vertically) versus frequency in GHz (horizontally).

In FIG. 5, the polyphase filter time domain response of the polyphase filter 43 is shown, in Volt (vertically) versus time in nsec (horizontally).

The frequency selector 45 according to the invention shown in FIG. 6 comprises a DC generator 120 coupled to inputs $m_3,m_4$ of a multiplexer 126 and to inputs $n_3,n_4$ of a multiplexer 127. The multiplexer 126 further comprises two inputs 131 or $m_1,m_2$ for receiving the differential second inphase oscillation signal (0°,180°), and the multiplexer 127 further comprises two inputs 132 or $n_1,n_2$ for receiving the differential second quadrature oscillation signal (90°,270°). The multiplexer 126 further comprises an input $qq_1$ coupled to an output $pp_1$, of a coder 125 via one or more wires or a bus, and the multiplexer 127 further comprises an input $qq_2$ coupled to an output $pp_2$ of the coder 125 via one or more wires or a bus. This coder 125 comprises an input 130 for receiving a band selection signal and converts this band selection signal into a control signal necessary for controlling the multiplexers 126,127. The multiplexer 126 supplies the differential second inphase oscillation signal (0°,180°) and the multiplexer 127 supplies the differential second quadrature oscillation signal (90°,270°).

A combination of these second oscillation signals corresponds with a positive frequency, a negative frequency or a zero frequency. The zero frequency is for example realised by controlling the multiplexers 126,127 with the DC generator 120. As a result, the device 1 is tuned to a second band. In case of supplying the combination of the second oscillation signals corresponding with a negative frequency, the device 1 is tuned to a first band, and in case of supplying the combination of the second oscillation signals corresponding with a positive frequency, the device 1 is tuned to a third band.

The multiplexer 126 shown in FIG. 7 for use in the frequency selector 45 comprises six transistors 140-145, with the input $qq_1$ for example comprising three sub-inputs $m_5,m_6, m_7$. The input $m_3$ is coupled to a first main electrode (source) of a first transistor 140, the input $m_1$ is coupled to a first main electrode (source) of a second transistor 141 and to a first main electrode (source) of a third transistor 142, the input $m_2$ is coupled to a first main electrode (source) of a fourth transistor 143 and to a first main electrode (source) of a fifth transistor 144, and the input $m_4$ is coupled to a first main electrode (source) of a sixth transistor 145. The input $m_6$ is coupled to a control electrode (gate) of the transistors 140 and 145. The input $m_5$ is coupled to a control electrode (gate) of the transistors 141 and 144. The input $m_7$ is coupled to a control electrode (gate) of the transistors 142 and 143. A second main electrode (drain) of the transistor 140 is coupled to a second main electrode (drain) of the transistor 141 and to a second main electrode (drain) of the transistor 143 and constitutes a first output of the multiplexer 126. A second main electrode (drain) of the transistor 145 is coupled to a second main electrode (drain) of the transistor 144 and to a second main electrode (drain) of the transistor 142 and constitutes a second output of the multiplexer 126. The multiplexer 127 may for example comprise a similar construction.

With a first band being situated around 3432 MHz (3960-528), a second band being situated around 3960 (3960+/−DC) MHz, and a third band being situated around 4488 MHz (3960+528), the first phase locked loop 41 will supply the 3960 MHz signal (in the form of $I_1+jQ_1$, with $I_1$ and $Q_1$ being differential signals) and the second phase locked loop 42 will supply the 528 MHz signal (in the form of $I_2+jQ_2$, with $I_2$ and $Q_2$ being differential signals).

In a prior art situation, it was a problem to generate a clean I&Q 528 MHz signal. This frequency is too low to use a quadrature LC-oscillator directly, and a ring-type oscillator will lead to a higher phase noise and will make it even more difficult to meet the demands on the I&Q quality of the signal (typically less than 1° phase error). A possible solution could be to employ a single LC-oscillator running at a frequency that is a multiple of 528 MHz (e.g. 4*528 MHz=2112 MHz). Static frequency division then yields the I&Q 528 MHz signal. However, such frequency division unavoidably generates odd harmonics of the 528 MHz. The third harmonic will be at a frequency of 1584 MHz. In case of I&Q signaling being used, the third harmonic of the 528 MHz is located at −1584 MHz if the 528 MHz signal has a positive frequency. When mixed with the 3960 MHz signal to create the center frequency of the first band (3432 MHz), this third harmonic causes a severe spur at the output at 3960+1584=5544 MHz, which is in the frequency range of the strong IEEE802.11a interferers. This means that this interferer will be reciprocally mixed down into the base band and thereby distort the wanted information disadvantageously.

In the prior art situation, a similar disadvantage was caused by the third harmonic of the 3960 MHz signal, located at −11.88 GHz. Shifting the fundamental of 3960 MHz to the left e.g. with the single side band mixer to generate the center frequency of the first band (3432 MHz) will also shift the −11.88 GHz signal to the left by 528 MHz, corresponding with a frequency of −12.408 GHz. The latter frequency is not exactly three times the center frequency of 3432 MHz and, thus, does not correspond to the third harmonic of the generated center frequency. This is not a problem itself, but when the generated center frequency is used to control a down-converter mixer in the signal path, the third order inter-modulation products will cause a severe spur at 5.544 GHz, which is a disadvantage, as described before.

According to the invention, these disadvantages are avoided by introducing the polyphase filters 43 and/or 44. The polyphase filter 43 for example performs polyphase filtering of the 528 MHz signal with a notch at −1584 MHz before applying it to the single side band mixer 46. The polyphase filter 44 for example performs polyphase filtering of the shifted third harmonic of 3960 MHz (located at around −12 GHz) after the single side band mixing.

The polyphase filter 43 is used to suppress the third harmonic of the 528 MHz signal. Because I&Q signaling is used, the third harmonic of the 528 MHz is located at −1584 MHz if the 528 MHz signal has a positive frequency. Without filtering, single side band mixing the 3960 MHz signal with −528 MHz to generate 3432 MHz (the first band) would result in a severe spur at 3960+1584=5544 MHz, which is close to the possibly strong IEEE802.11a interferers, causing reciprocal mixing. Thanks to the fact that the third harmonic spur has a frequency with opposite sign compared to the fundamental, polyphase filtering can be used more effectively than for example a band pass filter around 528 MHz to remove the third harmonic. An extra advantage is that I&Q phase errors on the 528 MHz signal will be suppressed by the polyphase filter as well, as these show up as a −528 MHz signal superposed on the wanted +528 MHz. Of course, owing to the fact that the polyphase filter 43 is located before the single side band mixer 46, this single side band mixer should be sufficiently linear.

The polyphase filter 44 is located after the single side band mixer 46, because the resulting spur at 12.408 GHz is relatively far away from the generated center frequency signals. Filtering the spur before mixing would require that the single side band mixer 46 that is controlled by the 3960 MHz signal is sufficiently linear. By filtering this time after the single side band mixer 46, this extra requirement is not imposed, which makes the design of the single side band mixer 46 easier. The unwanted spur in the single side band mixer output spectrum occurs as a negative frequency, in case of the generated center frequency being positive. This again enables polyphase filtering.

An additional advantage of polyphase filtering the single side band mixer output signal is that it can lower the noise on the center frequency signal (by lowering the noise at negative frequencies) and thereby lower the noise figure of the ultra wide band signal path. It also improves the I&Q matching of the center frequency signal.

The polyphase filter 43 as shown in FIG. 3 filters −1584 MHz signal (the third harmonic of 528 MHz). The lower stage has a zero at −1521 MHz, and the upper stage has a zero at −1650 MHz. So, these poles have their geographic mean value at the third harmonic frequency of 528 MHz. For the polyphase filter 44, which may have a similar construction, care should be taken that the lower transistor-stage has a low third-order distortion, otherwise it will introduce the spur at 5.544 GHz itself.

Each block shown in the Figures may comprise further filters, amplifiers etc. Sometimes, the ultra wide bands are called groups, and then the frequency channels in these groups are called bands. Other bands and frequency channels are not to be excluded. The invention may be applied in frequency hopping networks and in non-frequency hopping networks. In FIG. 1, both antennas 21 and 31 may be combined, and further blocks may be present. In FIG. 2, the phase locked loops 41 and 42 are just embodiments comprising the oscillators 53 and 63, other oscillating constructions are not to be excluded. The polyphase filters 43 and 44 may be of any kind of construction. The mixer 46 may be a single side band mixer of any construction. The polyphase filter 43 shown in FIG. 3 is just an embodiment, other kinds of polyphase filters are alternatively possible; the same holds for the polyphase filter 44. Although the suppression of third harmonics has been discussed, other harmonics may be suppressed as well or alternatively. In FIG. 6, other constructions may be used; the DC generator 120 may for example comprise a serial branch of a transistor, a first resistor, a second resistor, a biasing transistor and a third resistor, with for example both sides of the second resistor being coupled to the inputs $m_3, m_4$ and $n_3, n_4$. Other (configurations of) DC generators 120 for generating DC signals are not to be excluded. FIG. 7 just shows one embodiment of a multiplexer, without excluding other embodiments. Finally, each one of the bipolar NPN transistors in FIG. 3 and the PMOS transistors in FIG. 7 may be replaced by any kind of transistor. This all is valid without departing from the scope of this invention.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. Device (1) comprising:
   a frequency translating stage (20,30) for frequency translating a first signal into a second signal, at least one of the first signal and the second signal being an ultra wide band signal; and
   an oscillating stage (40) for supplying a main inphase oscillation signal and a main quadrature oscillation signal to the frequency translating stage (20,30), which oscillating stage (40) comprises:
   a first phase-locked loop (41), coupled to a reference source (47), for supplying a first inphase oscillation signal and a first quadrature oscillation signal;
   a second inphase-locked loop (42), coupled to said reference source (47), for supplying a second inphase oscillation signal and a second quadrature oscillation signal;
   a mixer (46) converting the first inphase oscillation signal and the first quadrature oscillation signal and the second inphase oscillation signal and the second quadrature oscillation signal into the main inphase oscillation signal and the main quadrature oscillation signal; a frequency selector (45), coupled to an input of the mixer (46), the frequency selector (45) comprising: a multiplexer (126, 127) for supplying the second inphase oscillation signal and the second quadrature oscillation signal to the mixer (46); and
   at least one polyphase filter (43,44) for reducing at least one harmonic in at least one of said first inphase oscillation signal, first quadrature oscillation signal, second inphase oscillation signal and second quadrature oscillation signal.

2. Device (1) according to claim 1, an input of the polyphase filter (44) being coupled to an output of the mixer (46).

3. Device (1) according to claim 1, an output of the polyphase filter (43) being coupled to an input of the mixer (46).

4. Device (1) according to claim 1, wherein an output of the frequency selector (45) is coupled to an input of the mixer (46).

5. Device (1) according to claim 4, wherein a combination of these second oscillation signals corresponding with a positive frequency, a negative frequency or a zero frequency; and a coder (125) for controlling the multiplexer (126,127).

6. Device (1) according to claim 1, the oscillating stage (40) further comprising a first oscillator (53) for supplying the first oscillation signals and a second oscillator (63) for supplying the second oscillation signals.

7. Device (1) according to claim 6, the oscillating stage (40) further comprising a reference source (47) coupled to the first (53) and the second (63) oscillator.

8. Device (1) according to claim 7, the reference source (47) being a X MHz source, the first oscillator (53) being a part of a first phase locked loop (41) generating at ABX MHz via a divide-by-A divider (51) and a divide-by-B divider (52) for supplying the first oscillation signals at BX MHz via the divide-by-A divider (51), the second oscillator (63) being a part of a second phase locked loop (42) generating at CDX MHz via a divide-by-C divider (61) and a divide-by-D (62) divider for supplying the second oscillation signals at DX MHz via the divide-by-C divider (61).

9. Device (1) according to claim 1, the stages (20,40) forming part of a receiver (2), which receiver (2) comprises an antenna (21) coupled to an input of the frequency translating stage (20) via an amplifier (22), the first signal being an ultra wide band signal and the second signal being a base band signal.

10. Device (1) according to claim 1, the stages (30,40) forming part of a transmitter (3), which transmitter (3) comprises an antenna (31) coupled to an output of the frequency translating stage (30) via an amplifier (32), the first signal being a base band signal and the second signal being an ultra wide band signal.

11. Oscillating stage (40) for supplying a main inphase oscillation signal and a main quadrature oscillation signal to a frequency translating stage (20,30) for frequency translating a first signal into a second signal, at least one of the first signal and the second signal being an ultra wide band signal, which oscillating stage (40) comprises:
   a first phase-locked loop (41), coupled to a reference source (47), for supplying a first inphase oscillation signal and a first quadrature oscillation signal;
   a second inphase-locked loop (42), coupled to said reference source (47), for supplying a second inphase oscillation signal and a second quadrature oscillation signal;
   a mixer (46) for converting the first inphase oscillation signal and the first quadrature oscillation signal and the second inphase oscillation signal and the second quadrature oscillation signal into the main inphase oscillation signal and the main quadrature oscillation signal;
   a frequency selector (45), coupled to an input of the mixer (46), the frequency selector (45) comprising: a multiplexer (126,127) for supplying the second inphase oscillation signal and the second quadrature oscillation signal to the mixer (46); and
   at least one polyphase filter (43,44) for reducing at least one harmonic in at least one of said first inphase oscillation signal, first quadrature oscillation signal, second inphase oscillation signal and second quadrature oscillation signal.

12. Frequency selector (45) comprising: a multiplexer (126,127) for supplying oscillation signals, a combination of these oscillation signals corresponding with a positive frequency, a negative frequency or a zero frequency; a coder (125) for controlling the multiplexer (126,127); and an output to be coupled to an input of a mixer (46) for converting a first inphase oscillation signal and a first quadrature oscillation signal and a second inphase oscillation signal and a second quadrature oscillation signal into a main inphase oscillation signal and a main quadrature oscillation signal of an oscillating stage (40) for supplying the main oscillation signals to a frequency translating stage (20,30) for frequency translating a first signal into a second signal, at least one of the first signal and the second signal being an ultra wide band signal, which oscillating stage (40) comprises at least one polyphase filter (43,44) for reducing at least one harmonic in at least one oscillation signal.

13. System comprising at least two devices (1), which devices (1) each comprise:
   a frequency translating stage (20,30) for frequency translating a first signal into a second signal, at least one of the first signal and the second signal being an ultra wide band signal; and
   an oscillating stage (40) for supplying a main inphase oscillation signal and a main quadrature oscillation signal to the frequency translating stage, which oscillating stage (40) comprises at least one polyphase filter (43,44) for reducing at least one harmonic in at least one oscillation signal, which oscillating stage (40) comprises:
- a first phase-locked loop (41), coupled to a reference source (47), for supplying a first inphase oscillation signal and a first quadrature oscillation signal;
- a second inphase-locked loop (42), coupled to said reference source (47), for supplying a second inphase oscillation signal and a second quadrature oscillation signal;
- a mixer (46) converting the first inphase oscillation signal and the first quadrature oscillation signal and the second inphase oscillation signal and the second quadrature oscillation signal into the main inphase oscillation signal and the main quadrature oscillation signal; a frequency selector (45), coupled to an input of the mixer (46), the frequency selector (45) comprising: a multiplexer (126, 127) for supplying the second inphase oscillation signal and the second quadrature oscillation signal to the mixer (46); and
- at least one polyphase filter (43,44) for reducing at least one harmonic in at least one of said first inphase oscillation signal, first quadrature oscillation signal, second inphase oscillation signal and second quadrature oscillation signal.

14. System according to claim 13, a device comprising a terminal device and an other device comprising a station device.

15. Method for use in a device (1), which method comprises the steps of:
- frequency translating a first signal into a second signal, at least one of the first signal and the second signal being an ultra wide band signal;
- supplying a first inphase oscillation signal and a first quadrature oscillation signal;
- supplying a second inphase oscillation signal and a second quadrature oscillation signal;
- converting the first inphase oscillation signal, the first quadrature oscillation signal into a main inphase oscillation signal for said frequency translating,
- converting the second inphase oscillation signal and the second quadrature oscillation signal into a main quadrature signal for said frequency translating, and
- polyphase filtering at least on said first inphase oscillations signal, first quadrature oscillation signal, second inphase oscillation signal and said quadrature oscillation signal; for reducing at least one harmonic in at least one oscillation signal.

16. Device (1) comprising: a frequency translating stage (20,30) for frequency translating a first signal into a second signal, at least one of the first signal and the second signal being an ultra wide band signal; and
- an oscillating stage (40) for supplying a main inphase oscillation signal and a main quadrature oscillation signal to the frequency translating stage (20,30), which oscillating stage (40) comprises at least one polyphase filter (43,44) for reducing at least one harmonic in at least one oscillation signal, which oscillating stage (40) further comprises a mixer (46) for converting a first inphase oscillation signal and a first quadrature oscillation signal and a second inphase oscillation signal and a second quadrature oscillation signal into the main oscillation signals, wherein an input of the polyphase filter (44) is coupled to an output of the mixer (46); and wherein an output of the polyphase filter (43) is coupled to an input of the mixer (46).

17. Device (1) according to claim 16, the oscillating stage (40) further comprising a frequency selector (45), an output of the frequency selector (45) being coupled to an input of the mixer (46).

18. Device (1) according to claim 17, the frequency selector (45) comprising: a multiplexer (126,127) for supplying the second inphase oscillation signal and the second quadrature oscillation signal, a combination of these second oscillation signals corresponding with a positive frequency, a negative frequency or a zero frequency; and a coder (125) for controlling the multiplexer (126,127).

19. Device (1) according to claim 16, the oscillating stage (40) further comprising a first oscillator (53) for supplying the first oscillation signals and a second oscillator (63) for supplying the second oscillation signals.

20. Device (1) according to claim 19, the oscillating stage (40) further comprising a reference source (47) coupled to the first (53) and the second (63) oscillator.

21. Device (1) according to claim 20, the reference source (47) being a X MHz source, the first oscillator (53) being a part of a first phase locked loop (41) generating at ABX MHz via a divide-by-A divider (51) and a divide-by-B divider (52) for supplying the first oscillation signals at BX MHz via the divide-by-A divider (51), the second oscillator (63) being a part of a second phase locked loop (42) generating at CDX MHz via a divide-by-C divider (61) and a divide-by-D (62) divider for supplying the second oscillation signals at DX MHz via the divide-by-C divider (61).

22. Device (1) according to claim 16, the frequency translation and oscillation stages (20,40) forming part of a receiver (2), which receiver (2) comprises an antenna (21) coupled to an input of the frequency translating stage (20) via an amplifier (22), the first signal being an ultra wide band signal and the second signal being a base band signal.

23. Device (1) according to claim 16, the frequency translation and oscillation stages (30,40) forming part of a transmitter (3), which transmitter (3) comprises an antenna (31) coupled to an output of the frequency translating stage (30) via an amplifier (32), the first signal being a base band signal and the second signal being an ultra wide band signal.

* * * * *